United States Patent
Ebina

(10) Patent No.: US 9,365,411 B2
(45) Date of Patent: Jun. 14, 2016

(54) MEMS DEVICE AND METHOD FOR MANUFACTURING THE SAME

(71) Applicant: SEIKO EPSON CORPORATION, Tokyo (JP)

(72) Inventor: Akihiko Ebina, Fujimi-machi (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 14/602,827

(22) Filed: Jan. 22, 2015

(65) Prior Publication Data

US 2015/0217992 A1 Aug. 6, 2015

(30) Foreign Application Priority Data

| Feb. 3, 2014 | (JP) | ................................. | 2014-018255 |
| Feb. 3, 2014 | (JP) | ................................. | 2014-018257 |
| Feb. 3, 2014 | (JP) | ................................. | 2014-018258 |

(51) Int. Cl.
| *H01L 21/00* | (2006.01) |
| *B81B 7/00* | (2006.01) |
| *B81B 3/00* | (2006.01) |
| *B81C 1/00* | (2006.01) |

(52) U.S. Cl.
CPC ............. *B81B 7/0041* (2013.01); *B81B 3/0021* (2013.01); *B81C 1/00293* (2013.01); *B81B 2201/0271* (2013.01); *B81B 2203/04* (2013.01); *B81B 2207/015* (2013.01); *B81B 2207/095* (2013.01); *B81C 2203/0136* (2013.01); *B81C 2203/0778* (2013.01)

(58) Field of Classification Search
CPC .................. B81B 2201/0271; B81B 2203/04; B81B 2207/015; B81B 2207/095; B81B 3/0021; B81B 7/0041; B81C 1/00293; B81C 2203/0136; B81C 2203/0778
USPC .............. 438/50, 125, 124, 48; 257/729, 415, 257/684; 427/105
See application file for complete search history.

(56) References Cited

U.S. PATENT DOCUMENTS

| 8,962,069 | B2* | 2/2015 | Pornin | ................ | B81C 1/00285 427/96.2 |
| 2003/0183916 | A1* | 10/2003 | Heck | .................. | B81C 1/00293 257/684 |
| 2012/0104593 | A1* | 5/2012 | Kanemoto | .......... | B81C 1/00333 257/729 |
| 2013/0243942 | A1* | 9/2013 | Pornin | ................ | B81C 1/00285 427/105 |
| 2014/0061824 | A1* | 3/2014 | Mohanakrishnaswamy | | B81C 1/00269 257/415 |

FOREIGN PATENT DOCUMENTS

JP         2010030021 A         2/2010

\* cited by examiner

*Primary Examiner* — Mohammed Shamsuzzaman
(74) *Attorney, Agent, or Firm* — Oliff PLC

(57) ABSTRACT

A MEMS device is provided in which, in order to suppress generation of a gas from an inner wall of a space in which a MEMS portion is disposed, the MEMS portion is disposed in a space constituted by at least a silicon nitride film and a silicon film, the silicon film has a first hole, the first hole is filled with a metal film or a metal silicide, and an airtight structure is formed by the metal film or the metal silicide, the silicon nitride film, and the silicon film.

5 Claims, 11 Drawing Sheets

Related Art

Schematic plan view

A-A' cross section

MEMS DEVICE AND METHOD FOR MANUFACTURING THE SAME

BACKGROUND

1. Technical Field

The present invention relates to a MEMS (Micro Electro Mechanical Systems) device and a method for manufacturing the MEMS device.

2. Related Art

Traditional MEMS devices are produced by disposing a MEMS portion such as an oscillator in a space, such as a cavity, that is vacuum sealed or hermetically sealed with an inert gas or the like at a given pressure (see JP-A-2010-30021 (FIG. 4)). This space, such as a cavity, is formed by using a dielectric film made of a silicon oxide film as a sacrificial material and removing this sacrificial material by etching. Thus, the silicon oxide film, which is likely to generate a gas, is mostly used for inner walls of the space such as a cavity. As a result, there are cases where the gas generated from the silicon oxide film collects in that space, resulting in a deterioration in the degree of vacuum or a change in the pressure of hermetic sealing. This causes a decrease in the performance and the reliability of the MEMS portion.

SUMMARY

Some aspects of the invention are directed to a MEMS device that suppresses generation of a gas from an inner wall of a space in which a MEMS portion is disposed and a method for manufacturing the MEMS device.

Moreover, some aspects of the invention are directed to a MEMS device that, while suppressing generation of a gas from an inner wall of a space in which a MEMS portion is disposed, enables an electrode of the MEMS portion to be lead to the outside of the space and a method for manufacturing the MEMS device.

An aspect of the invention is a MEMS device in which a MEMS portion is disposed in a space that is covered by a silicon nitride film and a silicon film.

According to the above-described aspect of the invention, since the space in which the MEMS portion is disposed is formed by the silicon nitride film and the silicon film, generation of a gas from an inner wall of the space can be suppressed.

An aspect of the invention is a MEMS device in which a MEMS portion is formed in a space that is covered by a silicon nitride film and a silicon film, wherein the silicon film has a first hole, the first hole is filled with a metal film, and an airtight structure is formed by the metal film, the silicon nitride film, and the silicon film.

According to the above-described aspect of the invention, since the space in which the MEMS portion is disposed is formed by the metal film, the silicon nitride film, and the silicon film, generation of a gas from an inner wall of the space can be suppressed.

Moreover, in the above-described aspect of the invention, the MEMS portion is disposed on the silicon nitride film, and the silicon film is disposed above the MEMS portion and is in close contact with the silicon nitride film that is located around the MEMS portion.

According to the above-described aspect of the invention, since the silicon film is in close contact with the silicon nitride film that is located around the MEMS portion, the MEMS portion can be three-dimensionally surrounded and hermetically sealed by the silicon film over the MEMS portion and the silicon nitride film under the MEMS portion, and thus the airtight structure can be made.

Moreover, in the above-described aspect of the invention, the MEMS device has a first dielectric film that is formed on the silicon film, a second hole that is formed in the first dielectric film and located on the first hole, and a second dielectric film that is formed on the first dielectric film, and the first and second holes are filled with the metal film.

According to the above-described aspect of the invention, since the first and second holes are filled with the metal film, and the second dielectric film is formed on that metal film, the metal film is completely embedded. Thus, the metal film is not exposed on the second dielectric film. Accordingly, the resistance of the MEMS portion to external mechanical stress can be improved.

Moreover, in the above-described aspect of the invention, the silicon film has a ring-shaped hole, the silicon film that is located inside the ring-shaped hole is electrically connected to the MEMS portion, and the ring-shaped hole is filled with a silicon nitride film.

According to the above-described aspect of the invention, two electrodes can be lead from the MEMS portion to the outside of the silicon film while maintaining the airtightness.

Moreover, in the above-described aspect of the invention, the MEMS device may have a dielectric film that is formed on the silicon film, a through-hole that is formed in the dielectric film, a hole that is formed in the silicon film and located under the through-hole, and a metal film that is embedded in the hole, wherein the airtight structure is formed by the metal film, the silicon nitride film, and the silicon film.

According to the above-described aspect of the invention, since the space in which the MEMS portion is disposed is formed by the metal film, the silicon nitride film, and the silicon film, generation of a gas from an inner wall of the space can be suppressed.

Moreover, in the above-described aspect of the invention, the dielectric film has the first dielectric film that is formed on the silicon film, the second dielectric film that is formed on the first dielectric film, and a third dielectric film that is formed on the second dielectric film.

Moreover, in an aspect of the invention, the hole is not disposed directly above the MEMS portion.

Moreover, in an aspect of the invention, the first hole is not disposed directly above the MEMS portion. Thus, a decrease in the reliability of the MEMS portion can be suppressed.

An aspect of the invention is a MEMS device, wherein a MEMS portion having a first electrode and a second electrode is disposed in a space that is covered by a first silicon nitride film and a silicon film, the silicon film has a first ring-shaped hole and a second ring-shaped hole, the silicon film that is located inside the first ring-shaped hole is electrically connected to the first electrode, the silicon film that is located inside the second ring-shaped hole is electrically connected to the second electrode, and each of the first and second ring-shaped holes is filled with a second silicon nitride film.

According to the above-described aspect of the invention, since the space in which the MEMS portion is disposed is formed by the silicon nitride films and the silicon film, generation of a gas from an inner wall of the space can be suppressed, and since the silicon film that is located inside the first ring-shaped hole is electrically connected to the first electrode, the silicon film that is located inside the second ring-shaped hole is electrically connected to the second electrode, the electrodes of the MEMS portion can be lead to the outside of the space.

Moreover, in the above-described aspect of the invention, the MEMS portion is disposed on the first silicon nitride film, and the silicon film is disposed above the MEMS portion and is in close contact with the first silicon nitride film that is located around the MEMS portion.

According to the above-described aspect of the invention, since the silicon film is in close contact with the first silicon nitride film that is located around the MEMS portion, the MEMS portion can be three-dimensionally surrounded and hermetically sealed by the silicon film over the MEMS portion and the first silicon nitride film under the MEMS portion, so that the airtight structure can be made.

Moreover, in the above-described aspect of the invention, the MEMS device may have a first electrode base that is disposed on the first electrode and disposed under the silicon film that is located inside the first ring-shaped hole, a second electrode base that is disposed on the second electrode and disposed under the silicon film that is located inside the second ring-shaped hole, and a silicon base that is disposed on the first silicon nitride film so as to be in close contact therewith, wherein the MEMS portion is disposed on the first silicon nitride film, the silicon base is located around the MEMS portion, and the silicon film is disposed above the MEMS portion and is in close contact with the silicon base.

According to the above-described aspect of the invention, since the space in which the MEMS portion is disposed is formed by the silicon nitride film and the silicon film, generation of a gas from an inner wall of the space can be suppressed, and the electrodes of the MEMS portion can be lead to the outside of the space by electrically connecting the silicon film that is located inside the first ring-shaped hole to the first electrode via the first electrode base and electrically connecting the silicon film that is located inside the second ring-shaped hole to the second electrode via the second electrode base.

Moreover, in the above-described aspect of the invention, the silicon film has a first hole, the first hole is filled with a metal film, and an airtight structure is formed by the metal film, the silicon film, and the first and second silicon nitride films.

Moreover, in the above-described aspect of the invention, the MEMS device has a first dielectric film that is formed on the silicon film, a second hole that is formed in the first dielectric film and located on the first hole, and a second dielectric film that is formed on the first dielectric film, and the first and second holes are filled with the metal film.

According to the above-described aspect of the invention, since the first and second holes are filled with the metal film, and the second dielectric film is formed on that metal film, the metal film is completely embedded. Thus, the metal film is not exposed on the second dielectric film. Accordingly, the resistance of the MEMS portion to external mechanical stress can be improved.

Moreover, in an aspect of the invention, the first hole is not disposed directly above a movable electrode of the MEMS portion. Thus, a decrease in the reliability of the MEMS portion can be suppressed.

Moreover, in an aspect of the invention, it is also possible that the MEMS portion is disposed on a semiconductor substrate, and an integrated circuit is formed on the semiconductor substrate. Forming the MEMS portion on the semiconductor substrate together with the integrated circuit in this manner enables a size reduction or a reduction in manufacturing cost.

Moreover, in an aspect of the invention, the MEMS portion has a movable electrode, a first electrode, and a second electrode.

An aspect of the invention is a method for manufacturing a MEMS device, the method including forming a MEMS portion on a first silicon nitride film; forming a sacrificial layer on the first silicon nitride film, the sacrificial layer covering the MEMS portion; forming a silicon film that is in close contact with the first silicon nitride film located around the sacrificial layer and that covers the sacrificial layer; forming a hole in the silicon film; and removing the sacrificial layer by supplying a wet etching solution to the sacrificial layer through the hole, whereby the MEMS portion is disposed in a space that is covered by the first silicon nitride film and the silicon film.

According to the above-described aspect of the invention, since the space in which the MEMS portion is disposed can be formed by the silicon nitride film and the silicon film, generation of a gas from an inner wall of the space can be suppressed.

Moreover, in the above-described aspect of the invention, the method may include forming a first connection hole and a second connection hole in the sacrificial layer after forming of the sacrificial layer and before forming of the silicon film; forming the silicon film in the first and second connection holes during forming of the silicon film and thereby electrically connecting the silicon film in the first and second connection holes to the MEMS portion; isolating the silicon film in the first connection hole by forming a first ring-shaped hole in the silicon film and isolating the silicon film in the second connection hole by forming a second ring-shaped hole in the silicon film after forming of the silicon film and before forming of the hole; and filling the first and second ring-shaped holes with a second silicon nitride film.

According to the above-described aspect of the invention, two electrodes can be lead from the MEMS portion to the outside of the silicon film while maintaining the airtightness.

Moreover, in the above-described aspect of the invention, the method may include, after filling of the first and second ring-shaped holes with the second silicon nitride film and before forming of the hole, forming a first dielectric film on the second silicon nitride film and the silicon film, forming a first interconnect layer on the first dielectric film, forming a second dielectric film on the first interconnect layer and the first dielectric film, forming a second interconnect layer on the second dielectric film, forming a third dielectric film on the second interconnect layer and the second dielectric film, and forming a through-hole in the first to third dielectric films, the through-hole being located on the hole; supplying the wet etching solution to the sacrificial layer through the through-hole and the hole during removing of the sacrificial layer; and embedding a metal film in the through-hole and the hole by sputtering after removing of the sacrificial layer, whereby the airtight structure is formed by the metal film, the first and second silicon nitride films, and the silicon film.

According to the above-described aspect of the invention, since the space in which the MEMS portion is disposed is formed by the metal film, the silicon nitride films, and the silicon film, generation of a gas from an inner wall of the space can be suppressed.

An aspect of the invention is a method for manufacturing a MEMS device, the method including forming a MEMS portion on a first silicon nitride film; forming a sacrificial layer on the first silicon nitride film, the sacrificial layer covering the MEMS portion; forming a silicon film that is in close contact with the first silicon nitride film located around the sacrificial layer and that covers the sacrificial layer; forming a first hole in the silicon film; removing the sacrificial layer by supplying a wet etching solution to the sacrificial layer through the first hole, whereby the MEMS portion is located in a space that is covered by the first silicon nitride film and the silicon film; and embedding a metal film in the first hole by sputtering, whereby the space is sealed.

According to the above-described aspect of the invention, since the space in which the MEMS portion is disposed is enclosed by the silicon nitride film, the silicon film, and the metal film, generation of a gas from an inner wall of the space can be suppressed.

Moreover, in the above-described aspect of the invention, the method may include forming a first dielectric film on the silicon film and forming a second hole in the first dielectric film after forming of the silicon film and before forming of the first hole; forming the first hole in the silicon film such that the first hole is located under the second hole during forming of the first hole in the silicon film; supplying the wet etching solution through the first and second holes during supplying of the wet etching solution to the sacrificial layer; embedding the metal film in the first and second holes during embedding of the metal film by sputtering; forming an interconnect layer on the first dielectric film; and forming a second dielectric film on the interconnect layer, the metal film, and the first dielectric film.

According to the above-described aspect of the invention, since the first and second holes are filled with the metal film, and the second dielectric film is formed on that metal film, the metal film is completely embedded. Thus, the metal film is not exposed on the second dielectric film. Accordingly, the resistance of the MEMS portion to external mechanical stress can be improved.

Moreover, in the above-described aspect of the invention, the method may include forming a first connection hole and a second connection hole in the sacrificial layer after forming of the sacrificial layer and before forming of the silicon film; forming the silicon film in the first and second connection holes during forming of the silicon film and thereby electrically connecting the silicon film in the first and second connection holes to the MEMS portion; isolating the silicon film in the first connection hole by forming a first ring-shaped hole in the silicon film and isolating the silicon film in the second connection hole by forming a second ring-shaped hole in the silicon film after forming of the silicon film and before forming of the first hole; and filling the first and second ring-shaped holes with a second silicon nitride film.

According to the above-described aspect of the invention, two electrodes can be lead from the MEMS portion to the outside of the silicon film while maintaining the airtightness.

Moreover, in the above-described aspect of the invention, the method may include forming a first connection hole and a second connection hole in the sacrificial layer after forming of the sacrificial layer and before forming of the silicon film; forming the silicon film in the first and second connection holes during forming of the silicon film and thereby electrically connecting the silicon film in the first and second connection holes to the MEMS portion; isolating the silicon film in the first connection hole by forming a first ring-shaped hole in the silicon film and isolating the silicon film in the second connection hole by forming a second ring-shaped hole in the silicon film during forming of the first hole; filling the first hole and the first and second ring-shaped holes with a second silicon nitride film after forming of the first hole in the silicon film and before removing of the sacrificial layer; and removing the second silicon nitride film that is filled in the first hole.

According to the above-described aspect of the invention, two electrodes can be lead from the MEMS portion to the outside of the silicon film while maintaining the airtightness.

An aspect of the invention is a method for manufacturing a MEMS device, the method including forming a MEMS portion on a first silicon nitride film, the MEMS portion having a first electrode and a second electrode; forming a sacrificial layer on the first silicon nitride film, the sacrificial layer covering the MEMS portion; forming a first connection hole that is located on the first electrode and a second connection hole that is located on the second electrode in the sacrificial layer; forming a silicon film that is formed on the first silicon nitride film located around the sacrificial layer, that is formed in the first and second connection holes, and that covers the sacrificial layer; isolating the silicon film in the first connection hole by forming a first ring-shaped hole in the silicon film and isolating the silicon film in the second connection hole by forming a second ring-shaped hole in the silicon film; filling the first and second ring-shaped holes with a second silicon nitride film; forming a first hole in the silicon film; and removing the sacrificial layer by supplying a wet etching solution to the sacrificial layer through the first hole, whereby the MEMS portion is disposed in a space that is covered by the first and second silicon nitride films and the silicon film.

According to the above-described aspect of the invention, since the space in which the MEMS portion is disposed is enclosed by the silicon nitride films and the silicon film, generation of a gas from an inner wall of the space can be suppressed, and the electrodes of the MEMS portion can be lead to the outside of the space by electrically connecting the silicon film that is located inside the first ring-shaped hole to the first electrode and electrically connecting the silicon film that is located inside the second ring-shaped hole to the second electrode.

An aspect of the invention is a method for manufacturing a MEMS device, the method including forming a MEMS portion having a first electrode and a second electrode on a first silicon nitride film; forming a sacrificial layer on the first silicon nitride film, the sacrificial layer covering the MEMS portion; forming a first connection hole that is located on the first electrode and a second connection hole that is located on the second electrode in the sacrificial layer; forming a silicon film that is formed on the first silicon nitride film located around the sacrificial layer, that is formed in the first and second connection holes and that covers the sacrificial layer; isolating the silicon film in the first connection hole by forming a first ring-shaped hole in the silicon film, isolating the silicon film in the second connection hole by forming a second ring-shaped hole in the silicon film, and forming a first hole in the silicon film; filling the first hole and the first and second ring-shaped holes with a second silicon nitride film; removing the second silicon nitride film that is filled in the first hole; and removing the sacrificial layer by supplying a wet etching solution to the sacrificial layer through the first hole, whereby the MEMS portion is located in a space that is covered by the first and second silicon nitride films and the silicon film.

According to the above-described aspect of the invention, since the space in which the MEMS portion is disposed is enclosed by the silicon nitride films and the silicon film, generation of a gas from an inner wall of the space can be suppressed, and the electrodes of the MEMS portion can be lead to the outside of the space by electrically connecting the silicon film that is located inside the first ring-shaped hole to the first electrode and electrically connecting the silicon film that is located inside the second ring-shaped hole to the second electrode.

Moreover, in an aspect of the invention, the MEMS portion has a movable electrode, and the method may include, during forming of the MEMS portion, forming a first electrode, a second electrode, and a first silicon base on the first silicon nitride film, the first silicon base surrounding the first and second electrodes, thereafter forming a first electrode base on the first electrode, forming the movable electrode and a second electrode base on the second electrode, and forming a second silicon base on the first silicon base; during forming of the sacrificial layer that covers the MEMS portion, forming the sacrificial layer on the first silicon nitride film, the sacrificial layer covering the first and second electrode bases and the first and second silicon bases; during forming of the first and second connection holes in the sacrificial layer, forming the first connection hole that is located on the first electrode base, the second connection hole that is located on the second electrode base, and a groove that is located on the second silicon base in the sacrificial layer; during forming of the silicon film, forming the silicon film in the groove; and removing the sacrificial layer, whereby the MEMS portion, the first and second electrode bases, and the first and second silicon bases are located in the space.

According to the above-described aspect of the invention, since the space in which the MEMS portion is disposed is enclosed by the silicon nitride films and the silicon film, generation of a gas from an inner wall of the space can be suppressed, and the electrodes of the MEMS portion can be lead to the outside of the space by electrically connecting the silicon film that is located inside the first ring-shaped hole to the first electrode via the first electrode base and electrically connecting the silicon film that is located inside the second ring-shaped hole to the second electrode via the second electrode base.

Moreover, in the above-described aspect of the invention, the method may include, after removing of the sacrificial layer, embedding a metal film in the first hole by sputtering, whereby the space is sealed.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, embodiments of the invention will be described in detail using the drawings. However, the invention is not limited to the following description, and it can be easily understood by a person skilled in the art that various changes may be made in the form and the details of the invention without departing from the spirit and scope of the invention. Therefore, the invention is not to be construed as being limited to the following description of the embodiments.

Embodiment 1

Figure 1A:
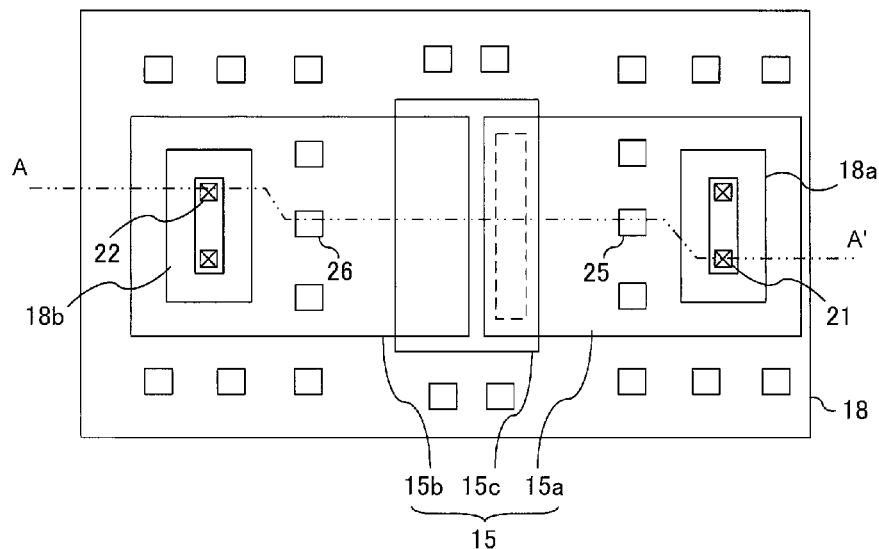
FIG. 1A is a plan view showing a MEMS device according to an aspect of the invention.
Figure 1B:
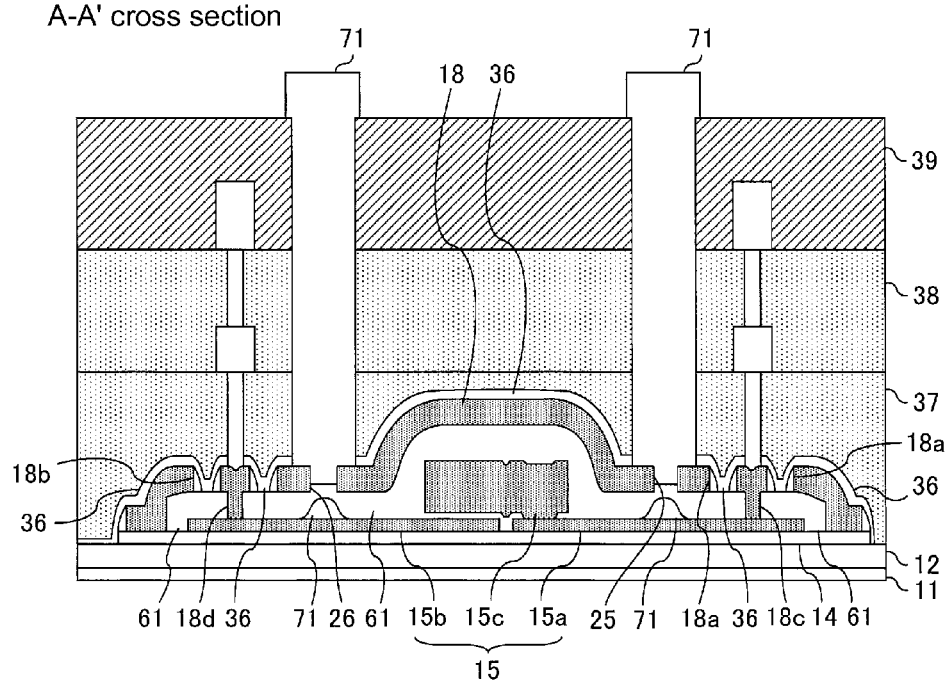
FIG. 1B is a cross-sectional view taken along line A-A' shown in FIG. 1A.

FIG. 1A is a plan view showing a MEMS device according to an aspect of the invention, and FIG. 1B is a cross-sectional view taken along line A-A' shown in FIG. 1A. FIGS. 2A to 2E, 3A, 3B, and 4 are cross-sectional views for explaining a method for manufacturing the MEMS device shown in FIG. 1B.

According to the aspect of the invention, in the middle of a manufacturing process of a semiconductor integrated circuit serving as a substrate, a manufacturing process of a MEMS device that involves an airtight structure is inserted, with excellent compatibility, immediately before formation of an FET (Field effect transistor), and subsequently, the formation of the FET and other steps such as formation of an interconnect layer are performed, and then the airtight structure of a cavity is produced.

Figure 2A:
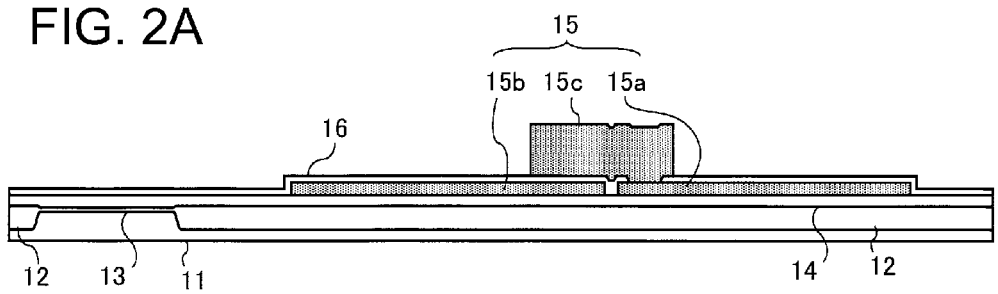
FIGS. 2A to 2E are cross-sectional views for explaining a method for manufacturing the MEMS device shown in FIG. 1B.

First, as shown in FIG. 2A, an element isolation film (STI: Shallow Trench Isolation) 12 is formed in an element isolation region of the silicon substrate 11. Then, an oxide film 13 is formed in an active region of the silicon substrate 11. Then, a first silicon nitride film 14 is formed on the entire surface including the element isolation film 12.

Next, a MEMS portion 15 is formed on the first silicon nitride film 14. This will be described in detail below.

A first conductive film is formed on the first silicon nitride film 14, and a first electrode 15a and a second electrode 15b that are made of the first conductive film are formed on the first silicon nitride film 14 by patterning the first conductive film. It should be noted that the first conductive film may be, for example, a polycrystalline silicon film, an amorphous silicon film, or a single-crystal silicon film. Then, a gap dielectric film 16 is formed on the first silicon nitride film 14 and the first and second electrodes 15a and 15b, and the gap dielectric film 16 is patterned. Then, a second conductive film is formed on the entire surface including the gap dielectric film 16, and a movable electrode 15c made of the second conductive film is formed on the gap dielectric film 16 by patterning the second conductive film. It should be noted that the second conductive film may be, for example, a polycrystalline silicon film, an amorphous silicon film, or a single-crystal silicon film. This movable electrode 15c is electrically connected to the first electrode 15a. In this manner, the MEMS portion 15 having the first electrode 15a, the second electrode 15b, and the movable electrode 15c is formed on the first silicon nitride film (see FIG. 1A).

It should be noted that the "MEMS portion" as used herein includes various MEMS portions as long as they have a movable electrode and at least two electrodes, and may be, for example, a resonator or the like.

Figure 2B:
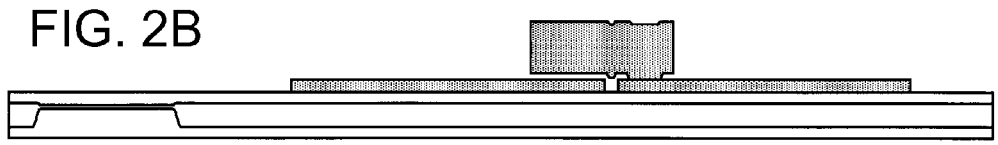

After that, as shown in FIG. 2B, the gap dielectric film 16 is removed by etching. Then, the MEMS portion 15 is heat-treated in a nitrogen atmosphere. Thus, the stress of the MEMS portion 15 can be released.

Figure 2C:
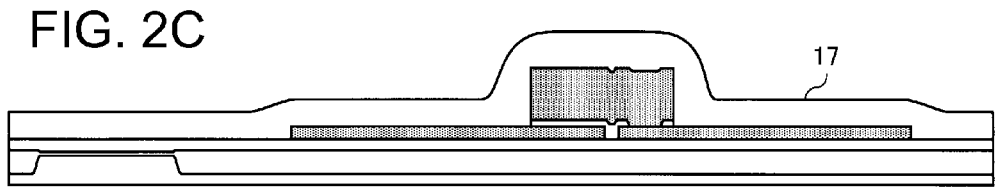

Next, as shown in FIG. 2C, a sacrificial layer 17 that covers the MEMS portion 15 is formed on the first silicon nitride film 14. This sacrificial layer 17 serves a function of protecting the MEMS portion 15.

Figure 2D:
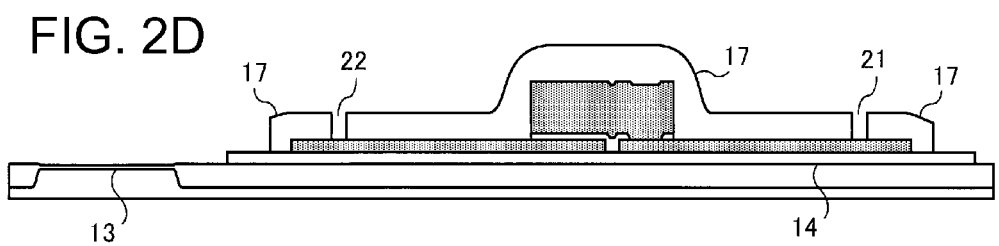

After that, as shown in FIG. 2D, a first connection hole 21 and a second connection hole 22 are formed in the sacrificial layer 17, and also an unnecessary part of the sacrificial layer is removed, by patterning the sacrificial layer 17. Then, the first silicon nitride film 14 is patterned.

Figure 2E:
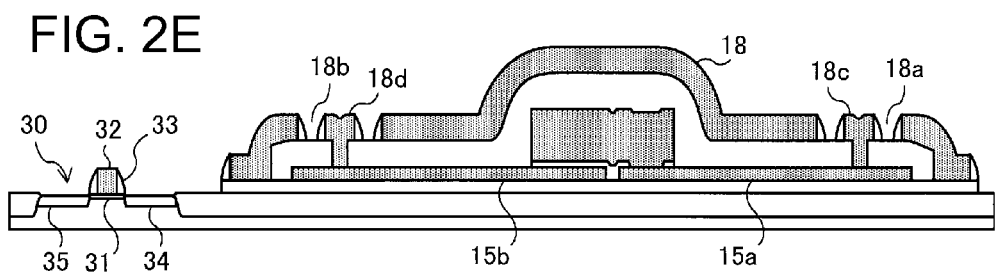

Next, as shown in FIG. 2E, an integrated circuit portion 30 is formed on the silicon substrate 11. This will be described in detail below.

A well (not shown) is formed by implanting impurity ions into the silicon substrate 11, and the oxide film 13 in the active region is removed. Then, a gate dielectric film 31 is formed in the active region of the silicon substrate 11 by a thermal oxidation method. Then, surfaces of the first and second electrodes 15a and 15b that are exposed in the first and second connection holes 21 and 22, respectively, are etched. Thus, electric contact of the first and second electrodes 15a and 15b via the first and second connection holes 21 and 22 is prevented from being inhibited.

It should be noted that with regard to the method for preventing electric contact of the first and second electrodes 15a and 15b from being inhibited, other methods may also be used. For example, the prevention of inhibition can also be realized by forming a polysilicon film before patterning the first silicon nitride film 14, the polysilicon film serving as a silicon film 18 that is in close contact with the first silicon nitride film 14 located around the sacrificial layer 17 and that covers the sacrificial layer 17. However, if this method is used, the polysilicon film serving as the silicon film 18 that covers the sacrificial layer 17 and a polysilicon film serving as a gate electrode 32 of the integrated circuit portion 30 would be formed in separate steps. A method in which the polysilicon films are formed in separate steps as described above has an advantage of making it possible to employ a polysilicon film suitable for the silicon film 18 that covers the sacrificial layer 17 and to employ a polysilicon film suitable for the gate electrode 32. However, in the description of the present embodiment, the method in which the silicon film 18 and the gate electrode 32 are formed of the same polysilicon film is used. This method has an advantage of making it possible to accelerate the process.

Then, a polysilicon film is formed so as to be placed on the gate dielectric film 31 and cover the sacrificial layer 17, and this polysilicon film is patterned. Thus, the gate electrode 32 is formed on the gate dielectric film 31, the silicon film 18 that is in close contact with the first silicon nitride film 14 located around the sacrificial layer 17 and that covers the sacrificial layer 17 is formed, the silicon film 18 (hereinafter also referred to as "electrode post") is formed in each of the first and second connection holes 21 and 22, and a first ring-shaped hole 18a and a second ring-shaped hole 18b are formed in the silicon film 18. At this time, due to the first and second ring-shaped holes 18a and 18b, an electrode post 18c in the first connection hole 21 is electrically isolated from the other part of the silicon film 18, and also an electrode post 18d in the second connection hole 22 is electrically isolated from the other part of the silicon film 18. Moreover, the electrode post 18c in the first connection hole 21 is electrically connected to the first electrode 15a, and the electrode post 18d in the second connection hole 22 is electrically connected to the second electrode 15b. That is to say, the silicon film portions 18 that are located inside the first and second ring-shaped holes 18a and 18b are electrically connected to the first and second electrodes 15a and 15b, respectively, of the MEMS portion 15 (see FIGS. 2E and 1A).

It should be noted that the "ring-shaped hole" as used herein is not limited to a hole shown in FIG. 1A that has a rectangular ring shape when viewed from above, and includes holes having various shapes (e.g., a circle, an ellipse, or the like) as long as the holes have the above-described electrically isolating function.

Then, a low-concentration impurity layer (not shown) is formed in a self-aligning manner using the gate electrode 32 as a mask. Then, a side wall 33 made of a silicon nitride film is formed on a side wall of the gate electrode 32. This side wall 33 is also formed on a side wall of the silicon film 18. Then, a source diffusion layer 34 and a drain diffusion layer 35 are formed in a self-aligning manner using the gate electrode 32 and the side wall 33 as a mask. It should be noted that a silicon oxide film can also be used for the side wall 33 of the gate electrode 32; however, in that case, the side wall made of the silicon oxide film that is formed on the side wall of the silicon film 18 should be removed.

Figure 3A:
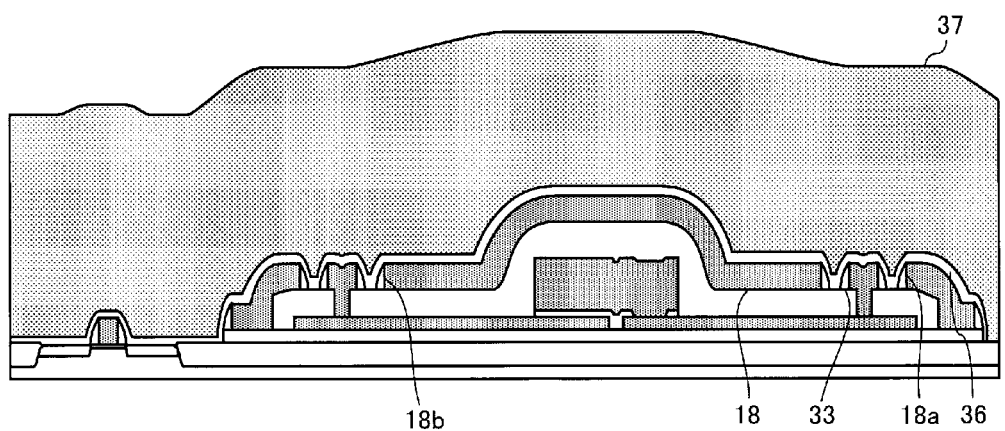
FIGS. 3A and 3B are cross-sectional views for explaining the method for manufacturing the MEMS device shown in FIG. 1B.

Next, as shown in FIG. 3A, a second silicon nitride film 36 is formed on the entire surface including the interior of the first and second ring-shaped holes 18a and 18b. Thus, the interior of the first and second ring-shaped holes 18a and 18b is filled with the second silicon nitride film 36. The second silicon nitride film 36 is in close contact with the silicon film 18 constituting the side walls of the first and second ring-shaped holes 18a and 18b, and thus the first and second ring-shaped holes 18a and 18b can be completely closed, so that an airtight structure can be realized after the sacrificial layer is removed in a step to be performed later. It should be noted that in the case where the side wall 33 made of the silicon nitride film is also formed on the side walls of the first and second ring-shaped holes 18a and 18b, this side wall 33 and the second silicon nitride film 36 are in close contact with the silicon film 18 on the side walls of the first and second ring-shaped holes 18a and 18b, and thus the first and second ring-shaped holes 18a and 18b can be completely closed.

Then, a first interlayer dielectric film 37 made of a silicon oxide film is formed on the second silicon nitride film 36.

Figure 3B:
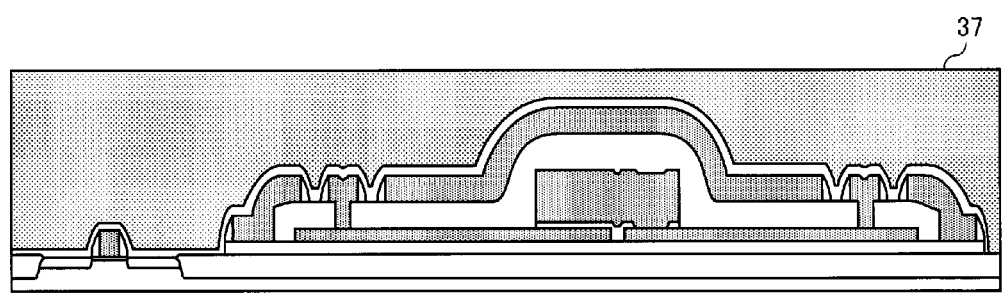

After that, as shown in FIG. 3B, the first interlayer dielectric film 37 is planarized by CMP (Chemical Mechanical Polishing).

Figure 4:
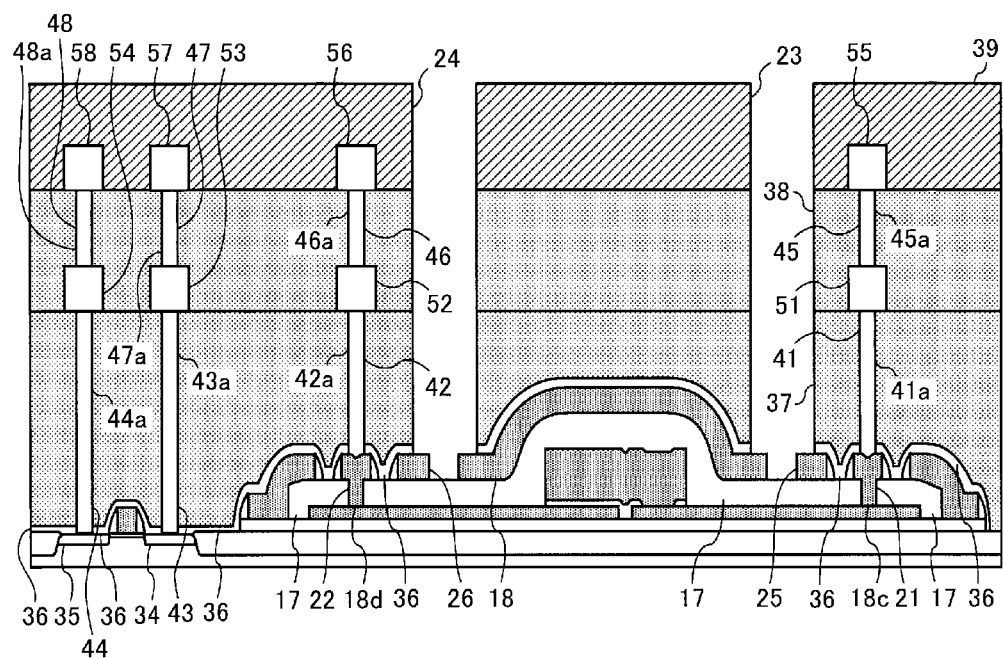
FIG. 4 is a cross-sectional view for explaining the method for manufacturing the MEMS device shown in FIG. 1B.

Next, as shown in FIG. 4, third to sixth connection holes 41a, 42a, 43a, and 44a are formed in the first interlayer dielectric film 37 and the second silicon nitride film 36 by etching. The third and fourth connection holes 41a and 42a are provided on the electrode posts 18c and 18d that are portions of the silicon film 18 and are surrounded by the first and second ring-shaped holes 18a and 18b, respectively, and thus insulated from the surroundings. The fifth and sixth connection holes 43a and 44a are shown as a typical example of ordinary contacts of the integrated circuit portion that is provided outside the region of the MEMS portion. After this connection hole forming step, the process is substantially the same as an interconnect process of an ordinary integrated circuit, except for release etching of the sacrificial layer. It should be noted that the presence of the region of this integrated circuit portion is not necessarily required.

Then, a third conductive film is formed in the third to sixth connection holes 41a, 42a, 43a, and 44a and on the first interlayer dielectric film 37, and the third conductive film that is present on the first interlayer dielectric film 37 is removed by CMP or etching back. Thus, a first conductive plug 41 is embedded in the third connection hole 41a, a second conductive plug 42 is embedded in the fourth connection hole 42a, a third conductive plug 43 is embedded in the fifth connection hole 43a, and a fourth conductive plug 44 is embedded in the sixth connection hole 44a. As a result, the first conductive plug 41 is electrically connected to the silicon film (electrode post) 18 that is located in the first connection hole 21, the second conductive plug 42 is electrically connected to the silicon film (electrode post) 18 that is located in the second connection hole 22, the third conductive plug 43 is electrically connected to the source diffusion layer 34, and the fourth conductive plug 44 is electrically connected to the drain diffusion layer 35.

Then, first interconnect layer portions 51, 52, 53, and 54 are formed on the first interlayer dielectric film 37 and the first to fourth conductive plugs 41, 42, 43, and 44. It should be noted that the "interconnect layer" as used herein includes a plurality of interconnect lines that are formed in a certain layer.

Then, a second interlayer dielectric film 38 made of a silicon oxide film is formed on the first interlayer dielectric film 37 and the first interconnect layer portions 51, 52, 53, and 54, and the second interlayer dielectric film 38 is planarized by CMP.

Then, seventh to tenth connection holes 45a, 46a, 47a, and 48a are formed in the second interlayer dielectric film 38 by etching. Then, a fourth conductive film is formed in the seventh to tenth connection holes 45a, 46a, 47a, and 48a and on the second interlayer dielectric film 38, and the fourth conductive film that is present on the second interlayer dielectric film 38 is removed by CMP or etching back. Thus, a fifth conductive plug 45 is embedded in the seventh connection hole 45a, a sixth conductive plug 46 is embedded in the eighth connection hole 46a, a seventh conductive plug 47 is embedded in the ninth connection hole 47a, and an eighth conductive plug 48 is embedded in the tenth connection hole 48a. As a result, the fifth to eighth conductive plugs 45, 46, 47, and 48 are electrically connected to the first interconnect layer portions 51, 52, 53, and 54, respectively.

Then, second interconnect layer portions 55, 56, 57, and 58 are formed on the second interlayer dielectric film 38 and the fifth to eighth conductive plugs 45, 46, 47, and 48. Then, a protective film (third dielectric film) 39 is formed on the second interlayer dielectric film 38 and the second interconnect layer portions 55, 56, 57, and 58.

Then, a first through-hole 23 and a second through-hole 24 that are located on the silicon film 18 are formed in the second silicon nitride film 36, the first interlayer dielectric film 37, the second interlayer dielectric film 38, and the protective film 39. Then, release holes 25 and 26 that are located under the first and second through-holes 23 and 24, respectively, are formed in the silicon film 18, and thus the sacrificial layer 17 is exposed.

Then, a wet etching solution is supplied to the sacrificial layer 17 through the first and second through-holes 23 and 24 and the release holes 25 and 26. Thus, the sacrificial layer 17 is removed. A space 61 is formed at a portion from which the sacrificial layer 17 has been removed. This space 61 is the space that is covered by the first and second silicon nitride films 14 and 36 and the silicon film 18, and the MEMS portion 15 is located in that space 61 (see FIG. 1B). It should be noted that there is good adhesion between the silicon film 18 and the first and second silicon nitride films 14 and 36, and therefore effusion of the wet etching solution does not occur.

After that, as shown in FIG. 1B, a metal film 71 (e.g., Al alloy film) is formed in the first and second through-holes 23 and 24, in the release holes 25 and 26, and on the protective film 39 by sputtering, and the metal film 71 on the protective film 39 is patterned. Thus, the metal film 71 is embedded in the first and second through-holes 23 and 24 and the release holes 25 and 26. As a result, the MEMS portion 15 is enclosed by the metal film 71, the first and second silicon nitride films 14 and 36, and the silicon film 18, and the airtight structure is formed. Moreover, the degree of vacuum (pressure) in the space 61 is equal to the degree of vacuum (pressure) at which sputtering of the metal film 71 is performed.

It should be noted that there are cases where, during sputtering of the metal film 71, a part of the metal film 71 may enter the space 61 under the release holes 25 and 26. For this reason, it is preferable if the release holes 25 and 26 are not disposed directly above the movable electrode 15c of the MEMS portion 15. This is because if the metal film 71 drops onto the movable electrode 15c, the performance of the MEMS portion 15 may be degraded.

Moreover, the "airtight structure" as used herein includes not only a structure that may be sealed in a high vacuum state but also a structure that may be sealed with a gas at a given pressure being hermetically sealed, and thus includes even a structure that is not exactly in an airtight state.

Comparative Example

In order to clarify the effects of the present embodiment, a comparative example will be described.

Figure 5A:
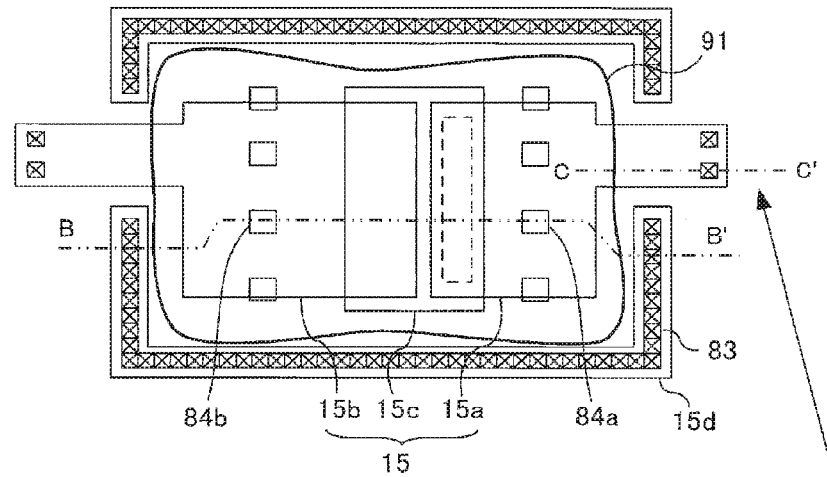
FIG. 5A is a plan view showing a MEMS device according to a comparative example.
Figure 5B:
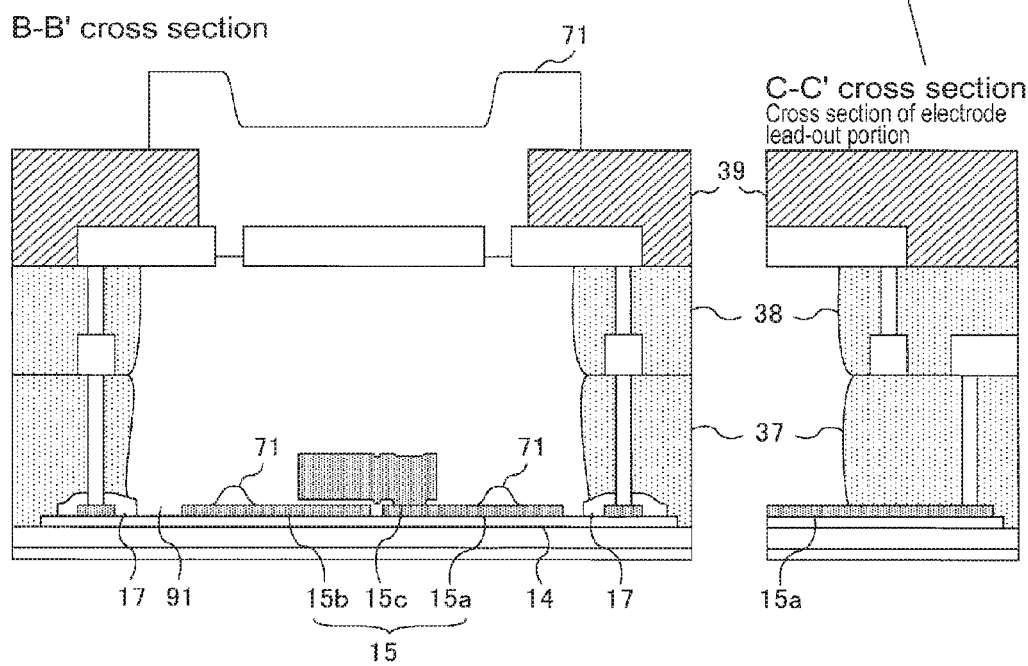
FIG. 5B shows cross-sectional views taken along line B-B' and line C-C', respectively, shown in FIG. 5A.

FIG. 5A is a plan view showing a MEMS device according to the comparative example, and FIG. 5B shows cross-sectional views taken along line B-B' and line C-C', respectively, shown in FIG. 5A. FIGS. 6A to 6G and 7 are cross-sectional views for explaining a method for manufacturing the MEMS device shown in FIG. 5B.

Figure 6A:
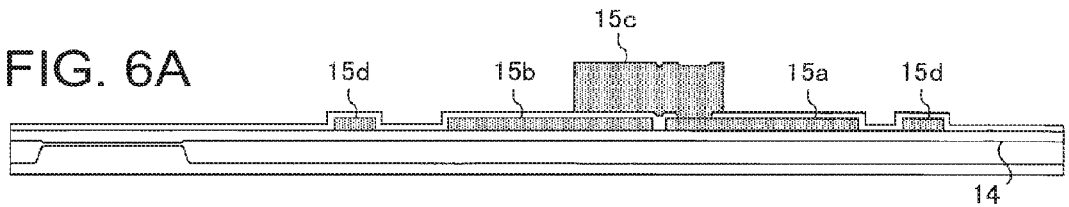
FIGS. 6A to 6G are cross-sectional views for explaining a method for manufacturing the MEMS device shown in FIG. 5B.

First, a step shown in FIG. 6A is the same as the step shown in FIG. 2A except that a base 15d as well as the first and second electrodes 15a and 15b, which are made of the first conductive film, are formed by forming the first conductive film on the first silicon nitride film 14 and patterning the first conductive film.

Figure 6B:
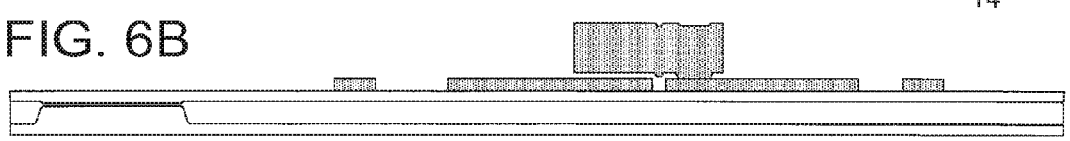
Figure 6C:
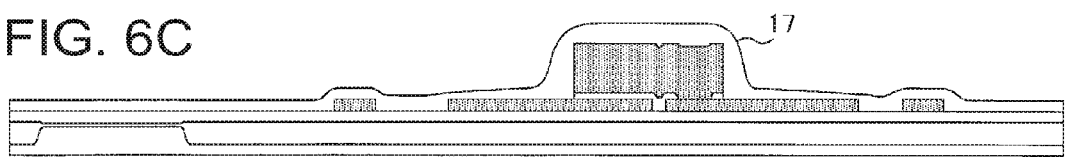

Moreover, a step shown in FIG. 6B is the same as the step shown in FIG. 2B, and a step shown in FIG. 6C is the same as the step shown in FIG. 2C.

Figure 6D:
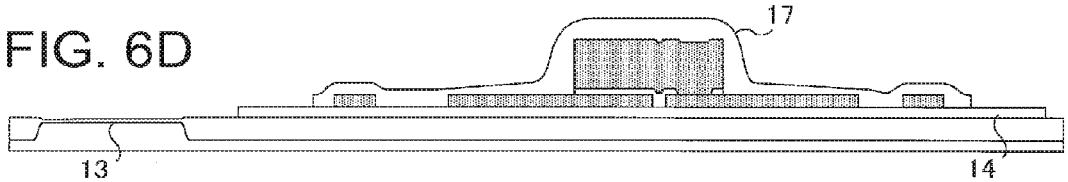

After that, as shown in FIG. 6D, the sacrificial layer 17 is patterned, and the first silicon nitride film 14 is patterned.

Figure 6E:
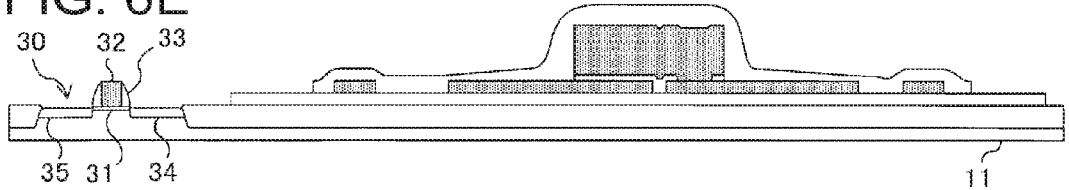

Next, in a step shown in FIG. 6E, similarly to the step shown in FIG. 2E, the integrated circuit portion 30 is formed on the silicon substrate 11. This step will be described in detail below.

A well (not shown) is formed by implanting impurity ions into the silicon substrate 11, and the oxide film 13 in the active region is removed. Then, the gate dielectric film 31 is formed in the active region of the silicon substrate 11 by a thermal oxidation method. Then, the polysilicon film is formed on the gate dielectric film 31, and the gate electrode 32 is formed on the gate dielectric film 31 by patterning this polysilicon film.

Then, the low-concentration impurity layer (not shown) is formed in a self-aligning manner using the gate electrode 32 as a mask. Then, the side wall 33 made of a silicon nitride film is formed on the side wall of the gate electrode 32. Then, the source diffusion layer 34 and the drain diffusion layer 35 are formed in a self-aligning manner using the gate electrode 32 and the side wall 33 as a mask.

Figure 6F:
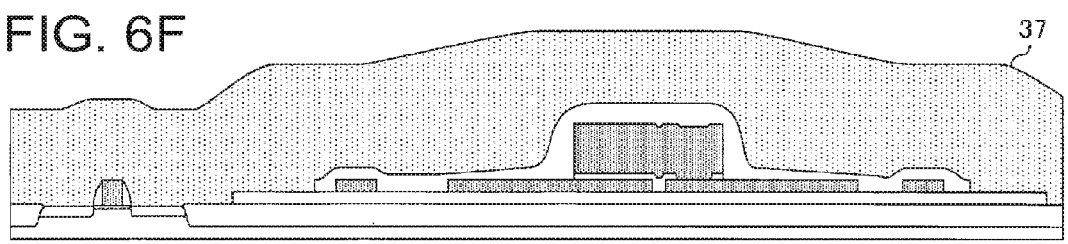

Next, as shown in FIG. 6F, the first interlayer dielectric film 37 made of a silicon oxide film is formed on the entire surface including the sacrificial layer 17.

Figure 6G:
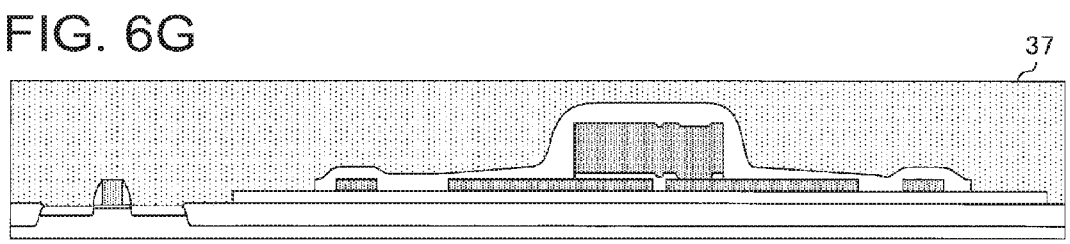

After that, as shown in FIG. 6G, the first interlayer dielectric film 37 is planarized by CMP.

Figure 7:
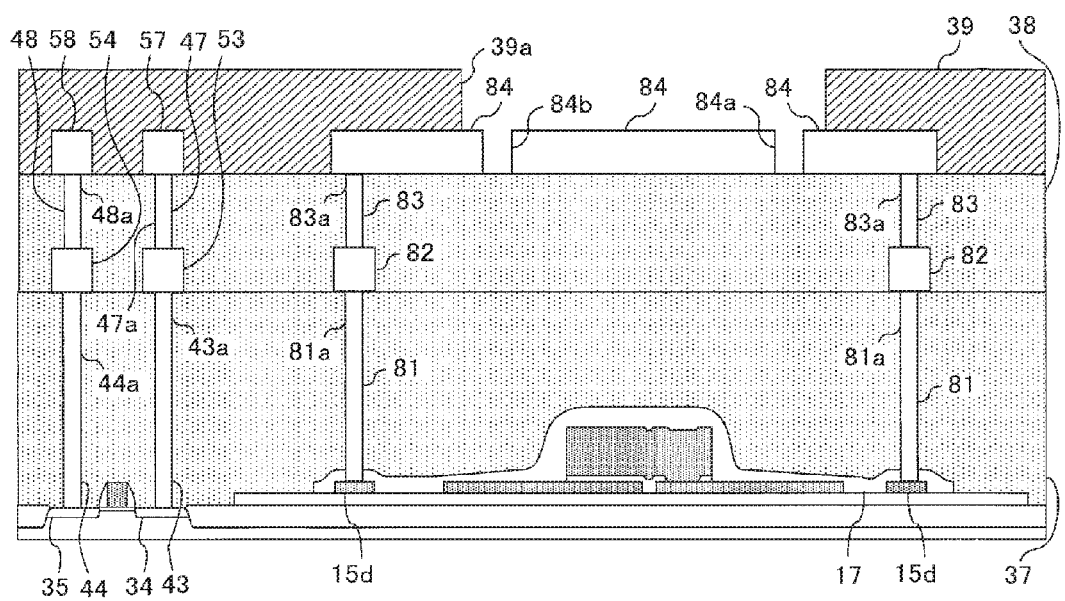
FIG. 7 is a cross-sectional view for explaining the method for manufacturing the MEMS device shown in FIG. 5B.

Next, as shown in FIG. 7, a groove 81a surrounding the MEMS portion 15 and the fifth and sixth connection holes 43a and 44a are formed in the first interlayer dielectric film 37 and the sacrificial layer 17 by etching. Then, the third conductive film is formed in the groove 81a, in the fifth and sixth connection holes 43a and 44a, and on the first interlayer dielectric film 37, and the third conductive film that is present on the first interlayer dielectric film 37 is removed by CMP or etching back. Thus, a wall-shaped conductive stack 81 is embedded in the groove 81a, the third conductive plug 43 is embedded in the fifth connection hole 43a, and the fourth conductive plug 44 is embedded in the sixth connection hole 44a. As a result, the conductive stack 81 is connected to the base 15d, the third conductive plug 43 is electrically connected to the source diffusion layer 34, and the fourth conductive plug 44 is electrically connected to the drain diffusion layer 35.

Then, a wall-shaped interconnect stack 82 and the first interconnect layer portions 53 and 54 are formed on the first interlayer dielectric film 37, the conductive stack 81, and the third and fourth conductive plugs 43 and 44.

Then, the second interlayer dielectric film 38 made of a silicon oxide film is formed on the first interlayer dielectric film 37, the interconnect stack 82, and the first interconnect layer portions 53 and 54, and the second interlayer dielectric film 38 is planarized by CMP.

Then, a groove 83a, the ninth connection hole 47a, and the tenth connection hole 48a are formed in the second interlayer dielectric film 38 by etching. Then, the fourth conductive film is formed in the groove 83a, in the ninth and tenth connection holes 47a and 48a, and on the second interlayer dielectric film 38, and the fourth conductive film that is present on the second interlayer dielectric film 38 is removed by CMP or etching back. Thus, a wall-shaped conductive stack 83 is embedded in the groove 83a, the seventh conductive plug 47 is embedded in the ninth connection hole 47a, and the eighth conductive plug 48 is embedded in the tenth connection hole 48a. As a result, the conductive stack 83 is connected to the interconnect stack 82, and the seventh and eighth conductive plugs 47 and 48 are electrically connected to the first interconnect layer portions 53 and 54, respectively.

Then, a metal lid 84 and the second interconnect layer portions 57 and 58 are formed on the second interlayer dielectric film 38, the conductive stack 83, and the seventh and eighth conductive plugs 47 and 48. The metal lid 84 is formed in the same layer as the second interconnect layer portions 57 and 58. Then, the protective film 39 is formed on the second interlayer dielectric film 38, the metal lid 84, and the second interconnect layer portions 57 and 58.

Then, an opening portion 39a that is located on the metal lid 84 is formed in the protective film 39. Then, release holes 84a and 84b are formed in the metal lid 84 that is exposed via the opening portion 39a.

Then, a wet etching solution is supplied to the second interlayer dielectric film 38, the first interlayer dielectric film 37, and the sacrificial layer 17 through the opening portion 39a and the release holes 84a and 84b. Thus, the first and second interlayer dielectric films 37 and 38 and the sacrificial layer 17 are removed, and a space 91 is formed at the removed portion. This space 91 is the space that is covered by the first and second interlayer dielectric films 37 and 38 and the sacrificial layer 17, and the MEMS portion 15 is located in the space (see FIG. 5B).

After that, the metal film 71 (e.g., Al alloy film) is formed in the opening portion 39a and the release holes 84a and 84b and on the protective film 39 by sputtering, the metal film 71 on the protective film 39 is patterned, and thus the metal film 71 is embedded in the opening portion 39a and the release holes 84a and 84b. Thus, the space 91 is enclosed by the metal film 71, the first and second interlayer dielectric films 37 and 38, the sacrificial layer 17, the first silicon nitride film 14, and the metal lid 84, and an airtight structure is formed.

It should be noted that during sputtering of the metal film 71, a part of the metal film 71 enters the space 91 under the release holes.

According to the present embodiment, since the space 61 in which the MEMS portion 15 is disposed is formed by the silicon nitride films and the silicon film 18, generation of a gas from the inner wall of the space 61 can be suppressed. Consequently, a change of the atmosphere in the space 61 from its initial atmosphere can be suppressed, so that the reliability of the MEMS device can be increased. In contrast, according to the comparative example, a gas is generated from the silicon oxide film constituting the inner wall of the space 91, and the generated gas collects in the space 91, causing the atmosphere in the space 91 to change from its initial atmosphere.

Moreover, according to the present embodiment, since the MEMS portion 15 is formed on the silicon substrate 11 together with the integrated circuit portion 30, a size reduction or a reduction in manufacturing cost can be achieved.

Moreover, according to the present embodiment, since the volume of the space 61 can be made smaller than that of the comparative example, the time required for etching of the sacrificial layer 17 can be reduced.

Embodiment 2

Figure 8A:
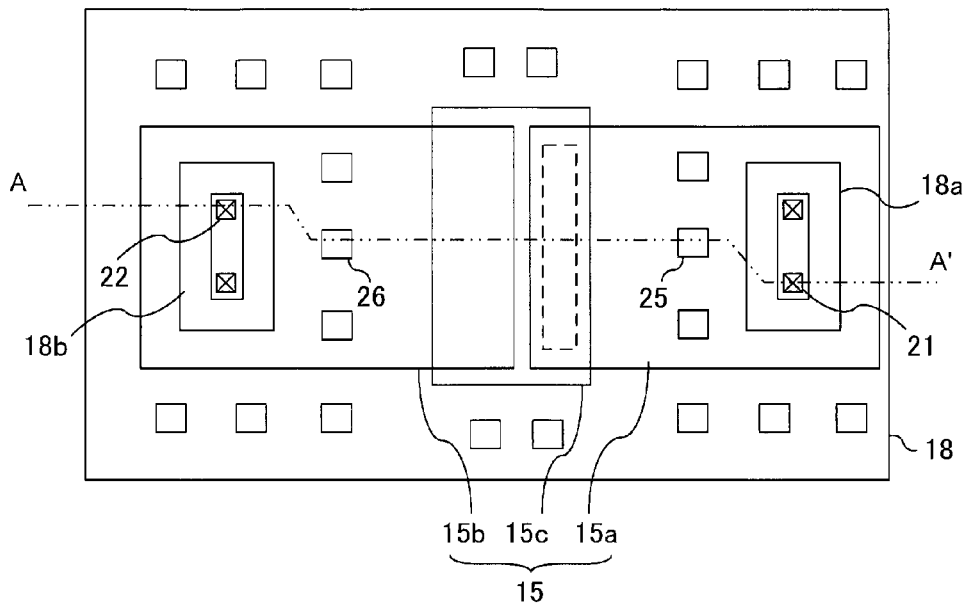
FIG. 8A is a plan view showing a MEMS device according to an aspect of the invention.
Figure 8B:
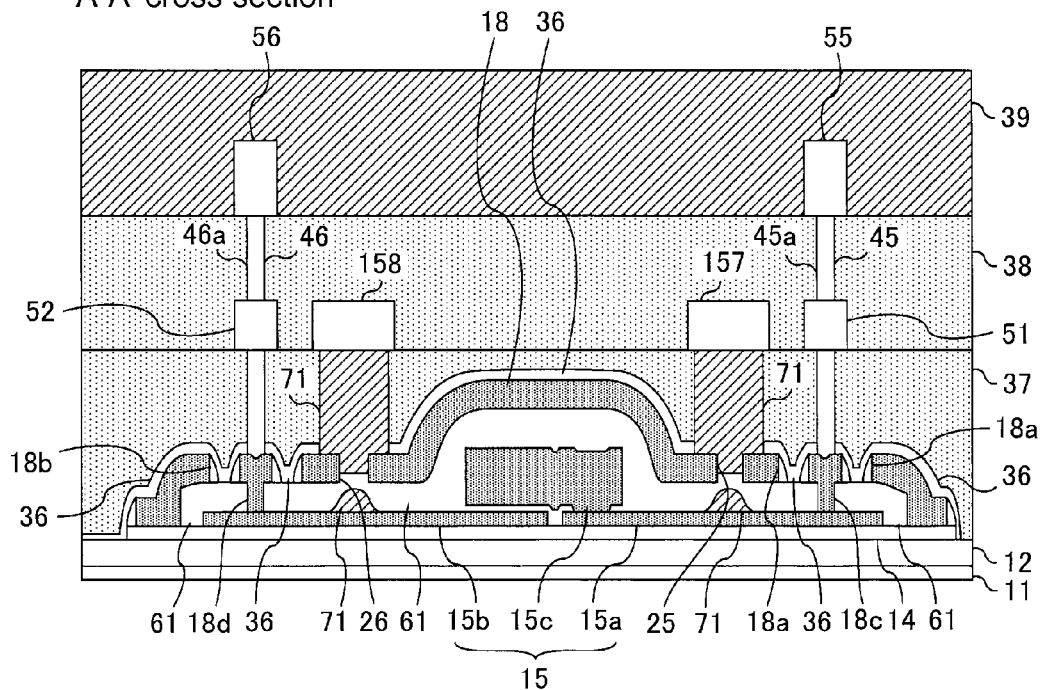
FIG. 8B is a cross-sectional view taken along line A-A' shown in FIG. 8A.
Figure 9A:
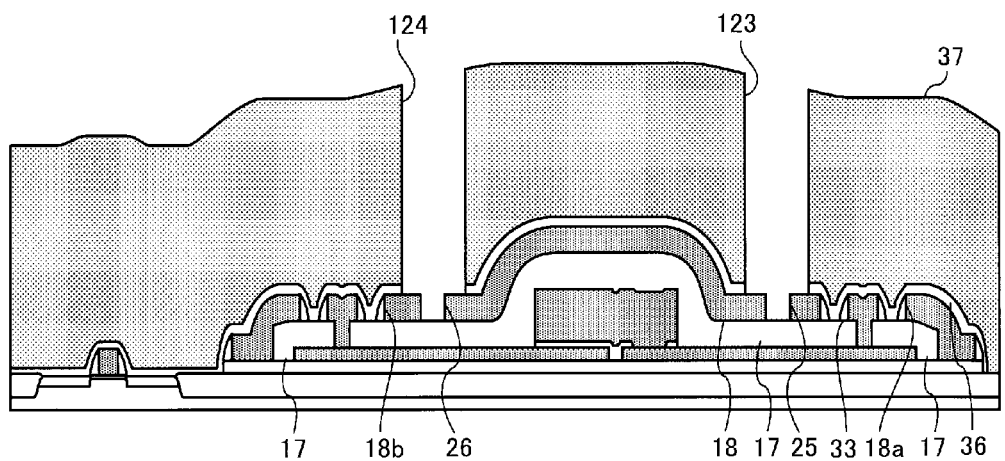
FIGS. 9A and 9B are cross-sectional views for explaining a method for manufacturing the MEMS device shown in FIG. 8B.
Figure 9B:
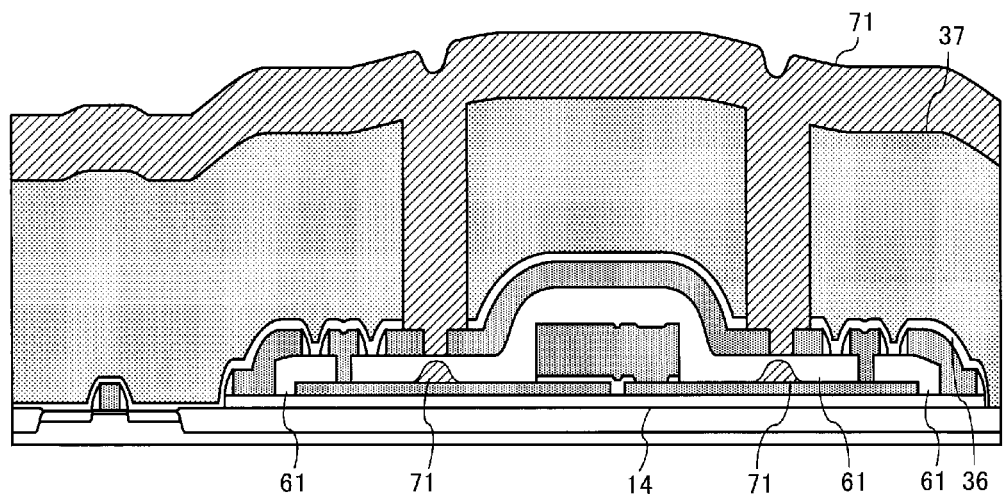
Figure 10:
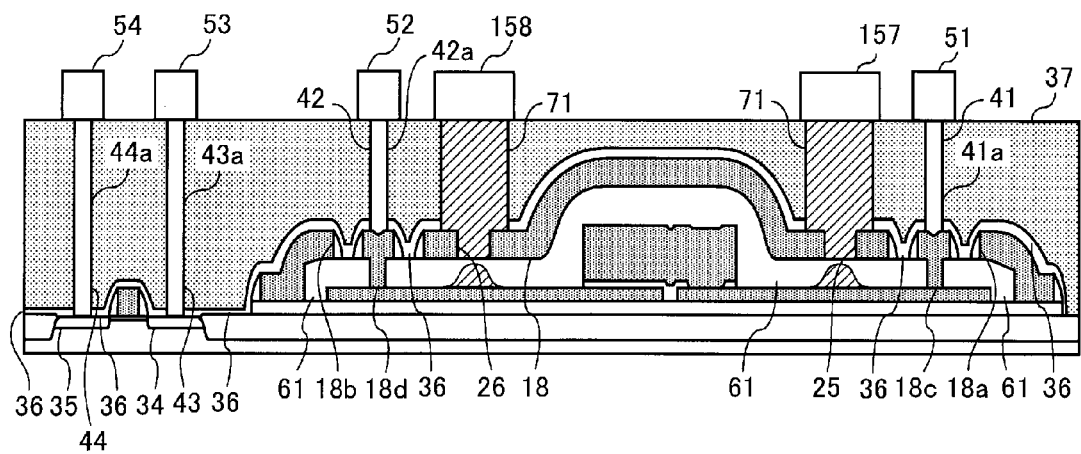
FIG. 10 is a cross-sectional for explaining the method for manufacturing the MEMS device shown in FIG. 8B.

FIG. 8A is a plan view showing a MEMS device according to an aspect of the invention, and FIG. 8B is a cross-sectional view taken along line A-A' shown in FIG. 8A. FIGS. 9A, 9B, and 10 are cross-sectional views for explaining a method for manufacturing the MEMS device shown in FIG. 8B.

According to the aspect of the invention, in the middle of a manufacturing process of a semiconductor integrated circuit serving as a substrate, a manufacturing process of a MEMS device that involves an airtight structure is inserted, with excellent compatibility, immediately before formation of an FET (Field effect transistor), and subsequently, the formation of the FET and other steps such as formation of an interconnect layer are performed, and then the airtight structure of a cavity is produced.

First, the steps shown in FIGS. 2A to 2E are performed in the same manner as in Embodiment 1.

Next, as shown in FIG. 9A, the second silicon nitride film 36 is formed on the entire surface including the interior of the first and second ring-shaped holes 18a and 18b. Thus, the interior of the first and second ring-shaped holes 18a and 18b is filled with the second silicon nitride film 36. The second silicon nitride film 36 is in close contact with the silicon film 18 constituting the side walls of the first and second ring-shaped holes 18a and 18b, and thus the first and second ring-shaped holes 18a and 18b can be completely closed, so that the airtight structure can be realized after the sacrificial layer is removed in a step to be performed later. It should be noted that in the case where the side wall 33 made of the silicon nitride film is also formed on the side walls of the first and second ring-shaped holes 18a and 18b, that side wall 33 and the second silicon nitride film 36 are in close contact with the silicon film 18 constituting the side walls of the first and second ring-shaped holes 18a and 18b, and thus the first and second ring-shaped holes 18a and 18b can be completely closed.

Then, the first interlayer dielectric film 37 made of a silicon oxide film is formed on the second silicon nitride film 36. Then, a photoresist film (not shown) is formed on the first interlayer dielectric film 37, and the first interlayer dielectric film 37 and the second silicon nitride film 36 are etched using this photoresist film as a mask. Thus, second holes 123 and 124 that are located on the silicon film 18 are formed in the first interlayer dielectric film 37 and the second silicon nitride film 36. Then, the release holes (first holes) 25 and 26 that are located under the respective second holes 123 and 124 are formed in the silicon film 18, and thus the sacrificial layer 17 is exposed.

It should be noted that in the present embodiment, the release holes 25 and 26 are formed after the second holes 123 and 124 are formed; however, a change may be made as follows. During formation of the first and second ring-shaped holes 18a and 18b in the silicon film 18 in the step shown in FIG. 2E, the release holes 25 and 26 are formed in the silicon film 18 at the same time as the first and second ring-shaped holes 18a and 18b. Then, during filling of the second silicon nitride film 36 in the first and second ring-shaped holes 18a and 18b in the step shown in FIG. 9A, the second silicon nitride film 36 is embedded in the first and second ring-shaped holes 18a and 18b and also in the release holes 25 and 26. After that, the first interlayer dielectric film 37 is formed on the second silicon nitride film 36, the second holes 123 and 124 are formed in the first interlayer dielectric film 37 and the second silicon nitride film 36, and thereby the second silicon nitride film 36 in the release holes 25 and 26 that are located under the second holes 123 and 124, respectively, is removed. The sacrificial layer 17 may be exposed in this manner.

After that, a wet etching solution is supplied to the sacrificial layer 17 through the second holes 123 and 124 and the release holes 25 and 26. Thus, the sacrificial layer 17 is removed as shown in FIG. 9B. The space 61 is formed at this portion from which the sacrificial layer 17 has been removed. This space 61 is the space that is covered by the first and second silicon nitride films 14 and 36 and the silicon film 18, and the MEMS portion 15 is located in the space 61. It should be noted that since there is good adhesion between the silicon film 18 and the first and second silicon nitride films 14 and 36, effusion of the wet etching solution does not occur.

Then, the metal film 71 (e.g., Al alloy film) is formed in the second holes 123 and 124, in the release holes 25 and 26, and on the first interlayer dielectric film 37 by sputtering. Thus, the metal film 71 is embedded in the second holes 123 and 124 and the release holes 25 and 26. As a result, the MEMS portion 15 is enclosed by the metal film 71, the first and second silicon nitride films 14 and 36, and the silicon film 18, and the airtight structure is formed (see FIG. 9B). Moreover, the degree of vacuum (pressure) in the space 61 is equal to the degree of vacuum (pressure) at which sputtering of the metal film 71 is performed.

It should be noted that during sputtering of the metal film 71, there are cases where a part of the metal film 71 may enter the space 61 under the release holes 25 and 26. For this reason, it is preferable if the release holes 25 and 26 are not disposed directly above the movable electrode 15c of the MEMS portion 15. This is because if the metal film 71 drops onto the movable electrode 15c, the performance of the MEMS portion 15 may be degraded.

Moreover, the "airtight structure" as used herein includes not only a structure that may be sealed in a high vacuum state but also a structure that may be sealed with a gas at a given pressure being hermetically sealed therein, and thus includes even a structure that is not exactly in an airtight state.

Next, as shown in FIG. 10, the metal film 71 on the first interlayer dielectric film 37 is removed by etching back, and then the first interlayer dielectric film 37 is planarized by CMP (Chemical Mechanical Polishing).

Then, the third to sixth connection holes 41a, 42a, 43a, and 44a are formed in the first interlayer dielectric film 37 and the second silicon nitride film 36 by etching. The third and fourth connection holes 41a and 42a are provided on the respective electrode posts 18c and 18d, which are portions of the silicon film 18 and are surrounded by the first and second ring-shaped holes 18a and 18b, respectively, and thus insulated from the surroundings. The fifth and sixth connection holes 43a and 44a are shown as a typical example of ordinary contacts of the integrated circuit portion that is provided outside the region of the MEMS portion. After this connection hole forming step, the process is substantially the same as an interconnect process of an ordinary integrated circuit, except for release etching of the sacrificial layer. It should be noted that the presence of the region of this integrated circuit portion is not necessarily required.

Then, the third conductive film is formed in the third to sixth connection holes 41a, 42a, 43a, and 44a and on the first interlayer dielectric film 37, and the third conductive film that is present on the first interlayer dielectric film 37 is removed by CMP or etching back. Thus, the first conductive plug 41 is embedded in the third connection hole 41a, the second conductive plug 42 is embedded in the fourth connection hole 42a, the third conductive plug 43 is embedded in the fifth connection hole 43a, and the fourth conductive plug 44 is embedded in the sixth connection hole 44a. As a result, the first conductive plug 41 is electrically connected to the silicon film (electrode post) 18 that is located in the first connection hole 21, the second conductive plug 42 is electrically connected to the silicon film (electrode post) 18 that is located in the second connection hole 22, the third conductive plug 43 is electrically connected to the source diffusion layer 34, and the fourth conductive plug 44 is electrically connected to the drain diffusion layer 35.

Then, a conductive film is formed on the first interlayer dielectric film 37 and the first to fourth conductive plugs 41, 42, 43, and 44, and this conductive film is patterned. Thus, the first interconnect layer portions 51, 52, 53, and 54 are formed on the first to fourth conductive plugs 41, 42, 43, and 44, respectively, and cap layer portions 157 and 158 are formed on the metal film 71 that is embedded in the respective second holes. It should be noted that the "interconnect layer" as used herein includes a plurality of interconnect lines that are formed in a certain layer.

After that, as shown in FIG. 8B, the second interlayer dielectric film 38 made of a silicon oxide film is formed on the first interlayer dielectric film 37, the first interconnect layer portions 51, 52, 53, and 54, and the cap layer portions 157 and 158, and the second interlayer dielectric film 38 is planarized by CMP.

Then, the seventh and eighth connection holes 45a and 46a and the ninth and tenth connection holes (not shown) are formed in the second interlayer dielectric film 38 by etching. Then, the fourth conductive film is formed in the seventh to tenth connection holes 45a, 46a, . . . and on the second interlayer dielectric film 38, and the fourth conductive film that is present on the second interlayer dielectric film 38 is removed by CMP or etching back. Thus, the fifth conductive plug 45 is embedded in the seventh connection hole 45a, the sixth conductive plug 46 is embedded in the eighth connection hole 46a, the seventh conductive plug (not shown) is embedded in the ninth connection hole (not shown), and the eighth conductive plug (not shown) is embedded in the tenth connection hole (not shown). As a result, the fifth and sixth conductive plugs 45 and 46 are electrically connected to the first interconnect layer portions 51 and 52, respectively, and the seventh and eighth conductive plugs are electrically connected to the first interconnect layer portions 53 and 54, respectively.

Then, the second interconnect layer portions 55 and 56 are formed on the second interlayer dielectric film 38 and the fifth and sixth conductive plugs 45 and 46, and also the second interconnect layer portions (not shown) are formed on the second interlayer dielectric film 38 and the seventh and eighth conductive plugs. Then, the protective film (third dielectric film) 39 is formed on the second interlayer dielectric film 38 and the second interconnect layer portions 55 and 56.

Comparative Example

A comparative example for clarifying the effects of the present embodiment is similar to the comparative example with respect to Embodiment 1, and therefore a detailed description thereof is omitted.

According to the present embodiment, since the space 61 in which the MEMS portion 15 is disposed is formed by the metal film 71, the silicon nitride films, and the silicon film 18, generation of a gas from the inner wall of the space 61 can be suppressed. Consequently, a change of the atmosphere in the space 61 from its initial atmosphere can be suppressed, and thus the reliability of the MEMS device can be increased. In contrast, according to the comparative example, a gas is generated from the silicon oxide film constituting the inner wall of the space 91, and the generated gas collects in the space 91, causing the atmosphere in the space 91 to change from its initial atmosphere.

Moreover, according to the present embodiment, since the space 61 in which the MEMS portion 15 is disposed is formed by the silicon nitride films and the silicon film 18, generation of a gas from the inner wall of the space 61 can be suppressed. In addition, since the first and second connection holes 21 and 22 are formed in the sacrificial layer 17, the silicon film 18 is embedded in the first and second connection holes 21 and 22, and the first and second ring-shaped holes 18a and 18b are formed in the silicon film 18, the electrode post 18c in the first connection hole 21 is electrically isolated from the other part of the silicon film 18 and the electrode post 18d in the second connection hole 22 is electrically isolated from the other part of the silicon film 18. Thus, the electrode post 18c in the first connection hole 21 is electrically connected to the first electrode 15a, and the electrode post 18d in the second connection hole 22 is electrically connected to the second electrode 15b. Consequently, a change of the atmosphere in the space 61 from its initial atmosphere can be suppressed, so that the reliability of the MEMS device can be increased, and also the first and second electrodes 15a and 15b of the MEMS portion can be lead to the outside of the space 61. In contrast, according to the comparative example, a gas is generated from the silicon oxide film constituting the inner wall of the space 91, and the generated gas collects in the space 91, causing the atmosphere in the space 91 to change from its initial atmosphere.

Moreover, according to the present embodiment, since the metal film 71 is embedded in the second holes 123 and 124 and the release holes 25 and 26, and the second interlayer dielectric film 38 is formed on the embedded metal film 71, the metal film 71 is completely embedded in an intermediate portion of a multilayered metal interconnection structure. Therefore, the metal film 71 is not exposed on the protective film 39 in the integrated circuit portion 30. Accordingly, the resistance of the MEMS portion 15 to external mechanical stress can be improved.

Moreover, according to the present embodiment, since the MEMS portion 15 is formed on the silicon substrate 11 together with the integrated circuit portion 30, a size reduction or a reduction in manufacturing cost can be achieved.

Moreover, according to the present embodiment, since the volume of the space 61 can be made smaller than that of the comparative example, the time required for etching of the sacrificial layer 17 can be shortened.

Embodiment 3

Figure 11A:
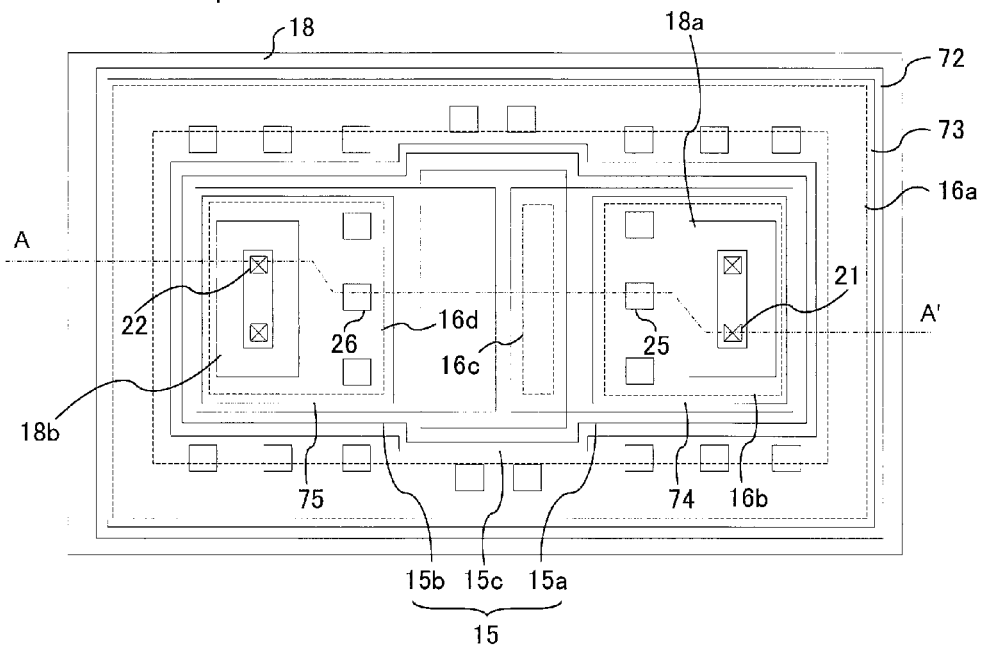
FIG. 11A is a plan view showing a MEMS device according to an aspect of the invention.
Figure 11B:
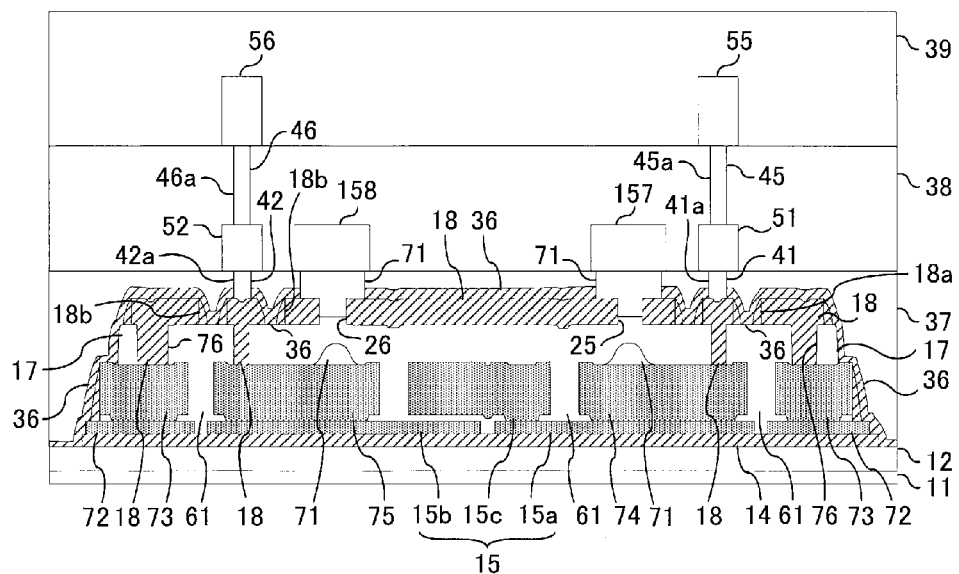
FIG. 11B is a cross-sectional view taken along line A-A' shown in FIG. 11A.

FIG. 11A is a plan view showing a MEMS device according to an aspect of the invention, and FIG. 11B is a cross-sectional view taken along line A-A' shown in FIG. 11A. In FIGS. 11A and 11B, the same portions as those of Embodiment 2 are denoted by the same reference numerals, and descriptions of those portions are omitted.

The steps to the formation of the first silicon nitride film 14 (the steps to the formation of the first silicon nitride film 14 shown in FIG. 2A) are similar to those of Embodiment 2.

Next, the MEMS portion 15 is formed on the first silicon nitride film 14. This will be described in detail below.

The first conductive film is formed on the first silicon nitride film 14, and the first electrode 15a, the second electrode 15b, and a first silicon base 72 that are made of the first conductive film are formed on the first silicon nitride film 14 by patterning the first conductive film. The first silicon base 72 is formed so as to surround the first and second electrodes 15a and 15b. Then, a gap dielectric film similar to that of Embodiment 2 is formed on the first silicon nitride film 14, the first silicon base 72, and the first and second electrodes 15a and 15b, and this gap dielectric film is patterned. Thus, contact holes 16a, 16b, 16c, and 16d are formed in the gap dielectric film. Then, the second conductive film is formed on the entire surface including the gap dielectric film, and the movable electrode 15c, a second silicon base 73, a first electrode base 74, and a second electrode base 75 that are made of the second conductive film are formed on the gap dielectric film by patterning the second conductive film. This movable electrode 15c is electrically connected to the first electrode 15a via the contact hole 16c, the first electrode base 74 is electrically connected to the first electrode 15a via the contact hole 16b, the second electrode base 75 is electrically connected to the second electrode 15b via the contact hole 16d, and the second silicon base 73 is disposed on the first silicon base 72 via the contact hole 16a. The second silicon base 73 is formed so as to surround the movable electrode 15c and the first and second electrode bases 74 and 75 (see FIG. 11A).

After that, the gap dielectric film is removed by etching in the same manner as in Embodiment 2.

Next, the sacrificial layer that covers the MEMS portion 15, the first and second electrode bases 74 and 75, and the first and second silicon bases 72 and 73 is formed on the first silicon nitride film 14 in the same manner as in Embodiment 2.

After that, similarly to Embodiment 2, the sacrificial layer is patterned, and thereby a groove 76, the first connection hole 21, and the second connection hole 22 are formed in the sacrificial layer and an unnecessary part of the sacrificial layer is removed. The groove 76 is located on the second silicon base 73, the first connection hole 21 is located on the first electrode base 74, and the second connection hole 22 is located on the second electrode base 75. Then, the first silicon nitride film 14 is patterned.

Next, similarly to Embodiment 2, the integrated circuit portion 30 is formed on the silicon substrate 11.

Then, similarly to Embodiment 2, the polysilicon film is formed so as to cover the sacrificial layer, and this polysilicon film is patterned. Thus, the silicon film 18 is formed in the groove 76, and this silicon film 18 is in close contact with the second silicon base 73 at a bottom portion of the groove 76.

Also, the silicon film 18 that covers the sacrificial layer 17 is formed. Also, the silicon film 18 is formed in the first and second connection holes 21 and 22, and this silicon film 18 is connected to the first and second electrode bases 74 and 75. Also, the first and second ring-shaped holes 18a and 18b are formed in the silicon film 18. At this time, due to the first and second ring-shaped holes 18a and 18b, the silicon film 18 in the first connection hole 21 is electrically isolated from the other part of the silicon film 18, and the silicon film 18 in the second connection hole 22 is electrically isolated from the other part of the silicon film 18. The silicon film 18 in the first connection hole 21 is electrically connected to the first electrode 15a via the first electrode base 74, and the silicon film 18 in the second connection hole 22 is electrically connected to the second electrode 15b via the second electrode base 75. That is to say, the silicon film portions 18 that are located inside the first and second ring-shaped holes 18a and 18b are electrically connected to the first and second electrodes 15a and 15b, respectively, of the MEMS portion 15 and constitute electrode lead-out portions (see FIGS. 11A and 11B).

Next, similarly to Embodiment 2, the second silicon nitride film 36 is formed on the entire surface including the first and second ring-shaped holes 18a and 18b. The following steps are the same as those of Embodiment 2. However, after the sacrificial layer is removed and thereby the space 61 is formed at the portion from which the sacrificial layer has been removed, the sacrificial layer 17 on the outside of the silicon film 18 that is embedded in the groove 76 still remains (see FIG. 11B). This remaining sacrificial layer 17 is located to the outside of the inner wall of the space 61 and therefore does not cause generation of a gas from the inner wall of the space 61.

The present embodiment can also provide the same effects as those of Embodiment 2.

Moreover, according to the present embodiment, since the first and second electrode bases 74 and 75 and the first and second silicon bases 72 and 73 are disposed, the silicon film 18 constituting a ceiling portion above the space 61 can be made flat.

Moreover, according to the present embodiment, since the silicon film 18 that covers an upper portion of the space 61 is formed on the second silicon base 73, steps that need to be covered by the silicon film 18 are limited to only a step that is present due to the thickness of the sacrificial material and do not depend on the thickness of the movable electrode 15c. For this reason, in the case where the movable electrode 15c has a large thickness, for example, in the case where the thickness of the movable electrode 15c is set to be larger than the thickness of the sacrificial layer in order to achieve desired characteristics of the MEMS device, the present embodiment has an advantage over Embodiment 2 in terms of the structure reliability and the processing difficulty of the silicon film 18.

Moreover, according to the present embodiment, since the first and second silicon bases 72 and 73 that surround the perimeter of the MEMS portion 15 are present, the area of the MEMS device is larger than that of Embodiment 2 shown in FIG. 8B. However, according to Embodiment 2 shown in FIG. 8B, it is necessary to leave room for a slope around the MEMS portion 15, and if the movable electrode 15c has a large thickness, it is necessary to leave much room for the slope. In contrast, according to the present embodiment, there is no necessity to leave room for such a slope, and therefore, actually, the area of the MEMS device is smaller than that of Embodiment 2 if the movable electrode 15c has a large thickness. Moreover, the volume of the sacrificial layer that is to be etched during release is also reduced by an amount corresponding to this slope, and thus the present embodiment has an advantage over Embodiment 2 also in terms of the processing cost.

It should be noted that in various embodiments of the invention, forming a specific component B (hereinafter referred to as "B") on (or under) a specific component A (hereinafter referred to as "A") is not limited to cases where B is formed directly on (or under) A. Cases where B is formed on (or under) A via another component without impeding the effects of the invention may also be included therein.

The entire disclosure of Japanese Patent Application No. 2014-018255, filed Feb. 3, 2014, No. 2014-018257, filed Feb. 3, 2014, No. 2014-018258, filed Feb. 3, 2014 are expressly incorporated by reference herein.

What is claimed is:

1. A MEMS device in which a MEMS portion is disposed in a space constituted by a silicon nitride film and a silicon film,
   wherein the silicon film has a first hole, the first hole is filled with a metal film or a metal silicide,
   an airtight structure is formed by the metal film or the metal silicide, the silicon nitride film, and the silicon film,
   wherein the MEMS portion is disposed on the silicon nitride film, and at least a first part of the silicon film is disposed above the MEMS portion and at least a second part of the silicon film is in close contact with the silicon nitride film, an entirety of the MEMS portion being disposed atop the silicon nitride film;
   wherein the MEMS portion having a first electrode is disposed in a space that is covered by a first silicon nitride film and a silicon film, the silicon film has a first ring-shaped hole,
   the silicon film that is located inside the first ring-shaped hole is electrically connected to the first electrode, and
   the first ring-shaped hole is filled with a second silicon nitride film.

2. The MEMS device according to claim 1, comprising:
   a first dielectric film that is formed on the silicon film;
   a second hole that is formed in the first dielectric film and located on the first hole; and
   a second dielectric film that is formed on the first dielectric film,
   wherein the first and second holes are filled with the metal film or the metal silicide.

3. The MEMS device according to claim 2,
   wherein a dielectric film has the first dielectric film that is formed on the silicon film, the second dielectric film that is formed on the first dielectric film, and a third dielectric film that is formed on the second dielectric film.

4. The MEMS device according to claim 1, comprising: a first electrode base that is disposed on the first electrode and under the silicon film that is located inside the first ring-shaped hole; and a silicon base that is disposed on the first silicon nitride film so as to be in close contact therewith, wherein the MEMS portion is disposed on the first silicon nitride film, the silicon base is located around the MEMS portion, and the silicon film is disposed above the MEMS portion and is in close contact with the silicon base.

5. The MEMS device according to claim 1,
   wherein the MEMS portion has a movable electrode, a first electrode, and a second electrode.

\* \* \* \* \*